(12) United States Patent
Seo et al.

(10) Patent No.: US 11,600,552 B2
(45) Date of Patent: Mar. 7, 2023

(54) SEMICONDUCTOR DEVICE HAVING A THROUGH SILICON VIA AND METHODS OF MANUFACTURING THE SAME

(71) Applicant: SAMSUNG ELECTRONICS CO., LTD., Suwon-si (KR)

(72) Inventors: Ju-Bin Seo, Seongnam-si (KR);
Su-Jeong Park, Hwaseong-si (KR);
Tae-Seong Kim, Suwon-si (KR);
Kwang-Jin Moon, Hwaseong-si (KR);
Dong-Chan Lim, Hwaseong-si (KR);
Ju-Il Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 92 days.

(21) Appl. No.: 17/344,138

(22) Filed: Jun. 10, 2021

(65) Prior Publication Data
US 2021/0296211 A1 Sep. 23, 2021

Related U.S. Application Data

(63) Continuation of application No. 16/386,393, filed on Apr. 17, 2019, now Pat. No. 11,043,445.

(30) Foreign Application Priority Data

Nov. 7, 2018 (KR) .......................... 10-2018-0135569

(51) Int. Cl.
*H01L 23/48* (2006.01)
*H01L 23/31* (2006.01)
(Continued)

(52) U.S. Cl.
CPC ...... *H01L 23/481* (2013.01); *H01L 21/76805* (2013.01); *H01L 21/76807* (2013.01);
(Continued)

(58) Field of Classification Search
CPC . H01L 23/481; H01L 23/3128; H01L 23/485; H01L 23/49827; H01L 23/5226;
(Continued)

(56) References Cited

U.S. PATENT DOCUMENTS

| 6,040,243 A | 3/2000 | Li et al. |
| 6,335,570 B2 | 1/2002 | Mori et al. |

(Continued)

FOREIGN PATENT DOCUMENTS

| JP | 2014-229667 A | 12/2014 |
| KR | 10-2017-0023643 A | 3/2017 |

OTHER PUBLICATIONS

Communication dated Jul. 11, 2022 by the Korean Intellectual Property Office in Korean Patent Application No. 10-2018-0135569.

*Primary Examiner* — Omar F Mojaddedi
(74) *Attorney, Agent, or Firm* — Sughrue Mion, PLLC

(57) ABSTRACT

A semiconductor device is provided. The semiconductor device includes a first insulating interlayer disposed on a first surface of a substrate; a pad pattern disposed on a lower surface of the first insulating interlayer, the pad pattern including a first copper pattern; and a through silicon via passing through the substrate and the first insulating interlayer, and contacting the first copper pattern of the pad pattern. The through silicon via includes a first portion passing through the substrate and the first insulating interlayer, and a second portion under the first portion and extending to a portion of the first copper pattern in the pad pattern. A boundary of the through silicon via has a bent portion between the first portion and the second portion.

20 Claims, 13 Drawing Sheets

(51) Int. Cl.

| | |
|---|---|
| *H01L 23/498* | (2006.01) |
| *H01L 23/522* | (2006.01) |
| *H01L 23/538* | (2006.01) |
| *H01L 27/146* | (2006.01) |
| *H01L 21/768* | (2006.01) |

(52) U.S. Cl.
CPC .. *H01L 21/76829* (2013.01); *H01L 21/76831* (2013.01); *H01L 21/76834* (2013.01); *H01L 21/76844* (2013.01); *H01L 21/76871* (2013.01); *H01L 21/76873* (2013.01); *H01L 21/76898* (2013.01); *H01L 23/3128* (2013.01); *H01L 27/14636* (2013.01)

(58) Field of Classification Search
CPC ............... H01L 23/528; H01L 23/5384; H01L 27/14636; H01L 27/14632; H01L 27/14687; H01L 27/14634; H01L 27/1469; H01L 25/0657; H01L 25/50
See application file for complete search history.

(56) References Cited

U.S. PATENT DOCUMENTS

| | | | |
|---|---|---|---|
| 6,555,461 | B1 | 4/2003 | Woo et al. |
| 7,416,963 | B2 | 8/2008 | Umemoto et al. |
| 7,700,497 | B2 | 4/2010 | Li |
| 7,973,415 | B2 | 7/2011 | Kawashita et al. |
| 8,703,605 | B2 | 4/2014 | Yang |
| 9,219,032 | B2 | 12/2015 | Ramachandran et al. |
| 9,728,490 | B2 | 8/2017 | Choi et al. |
| 9,773,831 | B1* | 9/2017 | Yang .................. H01L 27/14621 |
| 2011/0171582 | A1* | 7/2011 | Farooq ................ H01L 25/0657 430/314 |
| 2014/0070426 | A1* | 3/2014 | Park .................. H01L 23/53238 257/774 |
| 2014/0264883 | A1* | 9/2014 | Tsai ...................... H01L 23/481 257/762 |
| 2015/0380385 | A1* | 12/2015 | Hsu ................... H01L 27/14636 438/459 |
| 2017/0338203 | A1* | 11/2017 | Yuan ................. H01L 23/53295 |
| 2018/0122698 | A1 | 5/2018 | Zhang et al. |
| 2018/0286900 | A1* | 10/2018 | Chen ................. H01L 27/14609 |

* cited by examiner

SEMICONDUCTOR DEVICE HAVING A THROUGH SILICON VIA AND METHODS OF MANUFACTURING THE SAME

CROSS-REFERENCE TO THE RELATED APPLICATION

This application is a Continuation of U.S. application Ser. No. 16/386,393 filed Apr. 17, 2019, which claims priority from Korean Patent Application No. 10-2018-0135569, filed on Nov. 7, 2018 in the Korean Intellectual Property Office, the disclosures of which are incorporated by reference herein in their entireties.

BACKGROUND

1. Field

Apparatuses and methods consistent with example embodiments relate to a semiconductor device and method of manufacturing the same. More particularly, example embodiments relate to a semiconductor device including a through silicon via (TSV) formed through a silicon substrate and connected with a pad and methods of manufacturing the same.

2. Related Art

In a multi-chip package, stacked semiconductor chips may be electrically connected with each other using, e.g., a conductive bump. In this case, a through silicon via electrically connecting the conductive bump to a pad of the semiconductor chip may be formed in a semiconductor device.

Additionally, a via hole may be formed through a substrate to expose a pad pattern formed in an insulating interlayer. When the via hole is formed, re-sputtering a metal included in the pad pattern may result in metal contaminants attaching to a lower sidewall of the via hole adjacent to the pad pattern. The semiconductor device may have a poor reliability due to the metal contaminants.

SUMMARY

One or more example embodiments provide a semiconductor device having a TSV.

One or more example embodiments provide a method of manufacturing a semiconductor device having a TSV.

According to an aspect of an example embodiment, there is provided a semiconductor device. The semiconductor device includes a first insulating interlayer disposed on a first surface of a substrate; a pad pattern disposed on a lower surface of the first insulating interlayer, the pad pattern including a first copper pattern; and a through silicon via passing through the substrate and the first insulating interlayer, and contacting the first copper pattern of the pad pattern. The through silicon via includes a first portion passing through the substrate and the first insulating interlayer, and a second portion under the first portion and extending to a portion of the first copper pattern in the pad pattern, and a boundary of the through silicon via has a bent portion between the first portion and the second portion.

According to an aspect of an example embodiment, there is provided a method of manufacturing a semiconductor device. In the method of manufacturing the semiconductor device, a first insulating interlayer is formed on a first surface of a substrate. A pad pattern including a first copper pattern is formed on a lower surface of the first insulating interlayer. A via hole passing through the substrate and the first insulating interlayer is formed to expose a portion of a surface of the first copper pattern in the pad pattern. A through silicon via is formed in the via hole. The through silicon via contacts the first copper pattern of the pad pattern. The through silicon via includes a first portion passing through the substrate and the first insulating interlayer, and a second portion under the first portion and extending to the first copper pattern of the pad pattern. A boundary of the through silicon via has a bent portion between the first portion and the second portion.

According to an aspect of an example embodiment, there is provided a method of manufacturing a semiconductor device. In the method of manufacturing the semiconductor device, a first insulating interlayer is formed on a first surface of a substrate. A pad pattern is formed on a lower surface of the first insulating interlayer. The pad pattern includes a first copper pattern and a first barrier pattern on an upper surface and a sidewall of the first copper pattern. A first via hole passing through the substrate and the first insulating interlayer is formed to expose a portion of a surface of the first barrier pattern in the pad pattern. A sacrificial layer is formed on a surface of the first via hole. The sacrificial layer formed on a bottom of the first via hole and a surface of the first copper pattern thereunder are etched to form a second via hole that has a width less than a width of the first via hole. The sacrificial layer and copper contaminations on the sacrificial layer are etched to form a via hole. A through silicon via may be formed in the via hole. The through silicon via may contact the first copper pattern of the pad pattern.

In example embodiments, metal contaminants at portions adjacent to a lower sidewall of the TSV may not be generated, so that a failure of reliability may be decreased due to the metal contaminants.

BRIEF DESCRIPTION OF THE DRAWINGS

The above and other aspects, features and advantages will be more clearly understood from the following detailed description taken in conjunction with the accompanying drawings in which.

DETAILED DESCRIPTION

Figure 1:
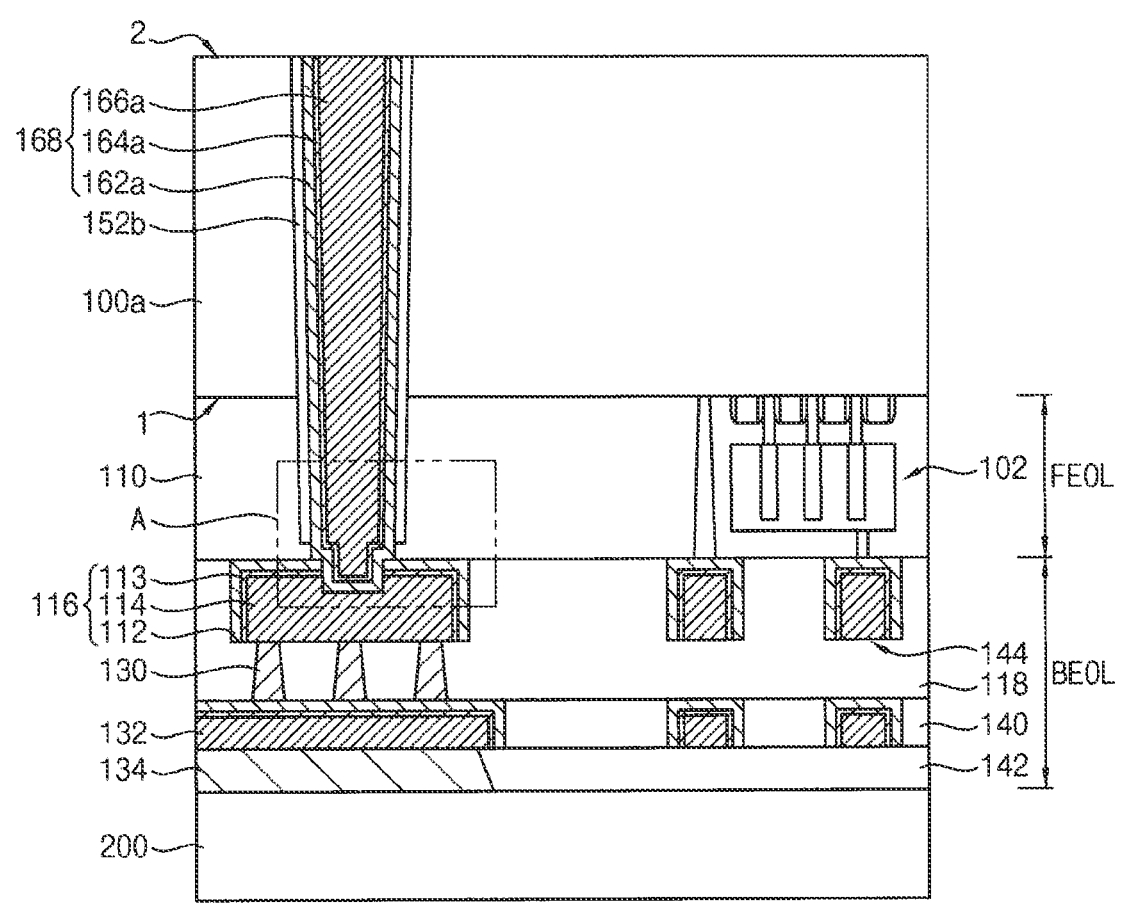
FIG. 1 is a cross-sectional view illustrating a semiconductor device including a through silicon via (TSV) in accordance with example embodiments.
Figure 2:
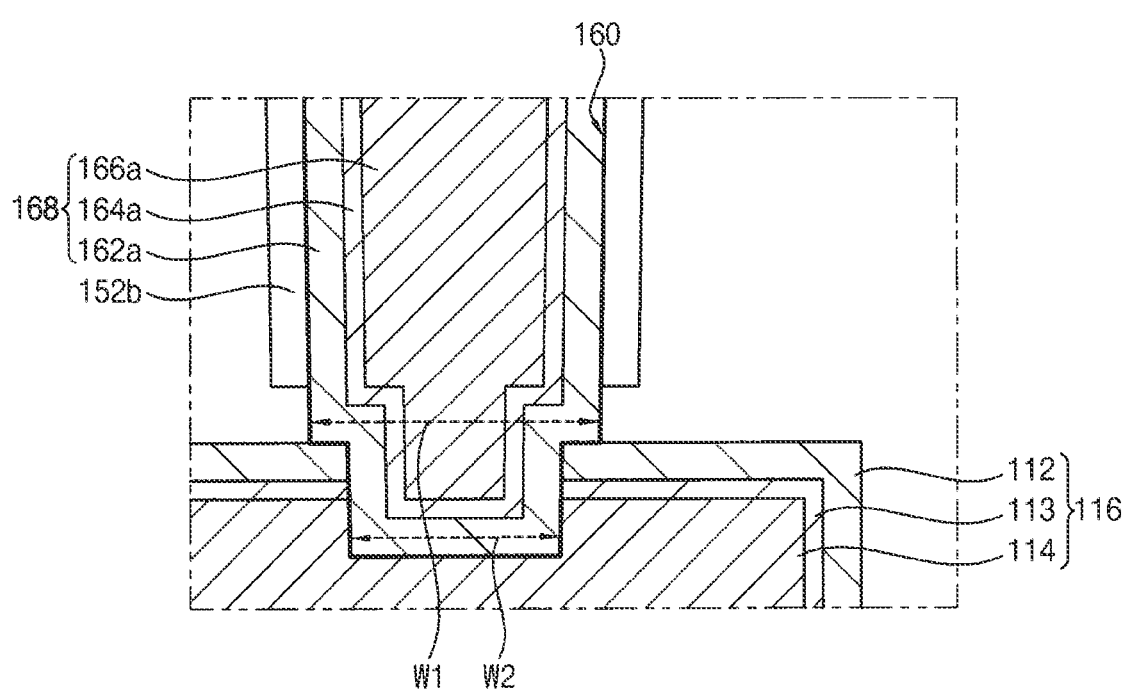
FIG. 2 is an enlarged cross-sectional view of a portion "A" in FIG. 1.

FIG. 1 is a cross-sectional view illustrating a semiconductor device 190 including a TSV in accordance with example embodiments. FIG. 2 is an enlarged cross-sectional view of a portion "A" in FIG. 1.

Referring to FIGS. 1 and 2, the semiconductor device 190 may include a substrate 100*a*, a first insulating interlayer 110, a pad pattern 116, and a through silicon via 168. In addition, the semiconductor device 190 may further include an insulation liner 152*b*, circuit elements 102, a first wiring structure 144, a second wiring structure 132, a pad electrode 134, a second insulating interlayer 118, a third insulating interlayer 140 and a fourth insulating interlayer 142.

The substrate 100a may include a semiconductor material. The substrate 100a may include, e.g., a silicon substrate, a germanium substrate, a silicon-germanium substrate, a silicon-on-insulator (SOI) substrate, a germanium-on-insulator (GOI) substrate, etc. In example embodiments, the substrate 100a may be formed by grinding a surface of a bare substrate 100 (refer to FIG. 3) to reduce thickness of the bare substrate 100. For example, the substrate 100a may include monocrystalline silicon.

The circuit elements 102 including transistors may be formed on a first surface 1 of the substrate 100a. The first surface 1 of the substrate 100a may be a front side of the substrate 100a, and the first surface 1 of the substrate 100a may be a surface on which the circuit elements 102 are formed. Also, a second surface 2 of the substrate 100a may be opposite to the first surface 1 of the substrate 100a, and the second surface 2 may be a back side of the substrate 100a. The circuit elements 102 may include, e.g., memory cells, pixels of an image sensor, logic devices, etc.

The first insulating interlayer 110 may be formed to cover the first surface 1 of the substrate 100a. That is, the first insulating interlayer 110 may be formed on the first surface 1 of the substrate 100a, and may cover the circuit elements 102. The first insulating interlayer 110 may include, e.g., silicon oxide. However, example embodiments are not limited thereto, and the first insulating interlayer 110 may include other insulation materials.

The second insulating interlayer 118 may cover a lower surface of the first insulating interlayer 110. The pad pattern 116 and the first wiring structure 144 may be formed in the second insulating interlayer 118.

The pad pattern 116 and the first wiring structure 144 may contact the lower surface of the first insulating interlayer 110, and may be positioned at an inner portion of the second insulating interlayer 118. Thus, the pad pattern 116 and the first wiring structure 144 may be disposed downward from the lower surface of the first insulating interlayer 110.

The pad pattern 116 may be spaced apart from a region where the circuit elements 102 may be formed. In example embodiments, the pad pattern 116 may be electrically connected to the circuit elements 102 by wirings.

The pad pattern 116 may include a first barrier pattern 112, a first seed copper pattern 113, and a first copper pattern 114.

The first barrier pattern 112 may include a first portion contacting the lower surface of the first insulating interlayer 110 and a second portion protruding downward from an edge of the first portion. Thus, the first barrier pattern 112 may have a cylindrical shape that forms an inner space. The first barrier pattern 112 may include, e.g., tantalum, tantalum nitride, etc. The first seed copper pattern 113 may be conformally formed on an inner surface of the cylindrical shape of the first barrier pattern 112. The first copper pattern 114 may be formed on the first seed copper pattern 113, and may fill an inner space of the first seed copper pattern 113.

Thus, in the pad pattern 116, a sidewall and an upper surface of the first copper pattern 114 may be covered with the first seed copper pattern 113 and the first barrier pattern 112. The first copper pattern 114, the first seed copper pattern 113 and the first barrier pattern 112 may be sequentially stacked. The first barrier pattern 112 may not be formed on a lower surface of the first copper pattern 114.

In example embodiments, a plurality of contact plugs 130 may be formed in the second insulating interlayer 118, and the contact plugs 130 may contact the lower surface of the pad pattern 116.

The first wiring structure 144 may be positioned at a region where the circuit elements 102 are formed, and may be electrically connected to the circuit elements 102. In example embodiments, the first wiring structure 144 may include a first barrier pattern 112, a first seed copper pattern 113 and a first copper pattern 114, and may be similar to a stacked structure of the pad pattern 116.

The third insulating interlayer 140 may cover a lower surface of the second insulating interlayer 118. The second wiring structure 132 may be formed in the third insulating interlayer 140. The second wiring structure 132 may be electrically connected to the pad pattern 116 and/or the first wiring structure 144. In example embodiments, the second wiring structure 132 may include a barrier pattern, a seed copper pattern and a copper pattern, and may be similar to a stacked structure of the pad pattern 116.

The fourth insulating interlayer 142 may cover a lower surface of the third insulating interlayer 140. The pad electrode 134 may be formed in the fourth insulating interlayer 142, and may be electrically connected to the pad pattern 116. In example embodiments, the pad electrode 134 may contact the contact plugs 130. In example embodiments, the pad electrode 134 may include, e.g., aluminum.

In example embodiments, a supporting substrate 200 may be further formed on a lower surface of the fourth insulating interlayer 142.

The through silicon via 168 may be formed through the substrate 100a and the first insulating interlayer 110 so that the through silicon via 168 may contact the first copper pattern 114 of the pad pattern 116.

The through silicon via 168 may include a second barrier pattern 162a, a second seed copper pattern 164a, and a second copper pattern 166a. The insulation liner 152b may surround a sidewall of the through silicon via 168.

The through silicon via 168 may be formed to fill a via hole 160 exposing the first copper pattern 114 through the substrate 100a and the first insulating interlayer 110.

The via hole 160 may have a first portion passing through the substrate 100a and the first insulating interlayer 110 and a second portion under the first portion and extending to the first copper pattern 114 of the pad pattern 116. The first portion of the via hole 160 may be disposed above an upper surface of the pad pattern 116. The first and second portions of the via hole 160 may be communicated with each other. In addition, a boundary between the first portion and the second portion of the via hole 160 may be bent. In this case, a width W1 of the first portion of the via hole 160 may be greater than a width W2 of the second portion of the via hole 160.

In example embodiments, a sidewall of the first portion of the via hole 160 may have a slope so that the width of the first portion may gradually increase from the first surface 1 of the substrate 100a toward the second surface 2 of the substrate 100a.

A lower surface of the first portion of the via hole 160 may expose a portion of an upper surface of the first barrier pattern 112 in the pad pattern 116. A lower surface of the second portion of the via hole 160 may expose a portion of the first copper pattern 114 in the pad pattern 116. In example embodiments, a sidewall of the second portion of the via hole 160 may expose the first barrier pattern 112, the first seed copper pattern 113 and the first copper pattern 114 in the pad pattern 116.

As the through silicon via 168 is formed in the via hole 160, a sidewall profile of the through silicon via 168 may be substantially the same as a sidewall profile of the via hole 160.

The through silicon via 168 may include a first portion passing through the substrate 100a and the first insulating interlayer 110 and a second portion under the first portion and extending to the first copper pattern 114 of the pad pattern 116. A boundary portion between the first portion and the second portion in the through silicon via 168 may be bent. Also, a width of the first portion of the through silicon via 168 may be greater than a width of the second portion of the through silicon via 168. In example embodiments, a width of the first portion of the through silicon via 168 at a boundary between the substrate 110a and the first insulating interlayer 110 may be greater than a width of the second portion of the through silicon via 168 at the upper surface of the pad pattern 116.

The second barrier pattern 162a included in the through silicon via 168 may contact at least a portion of the upper surface of the first barrier pattern 112 in the pad pattern 116.

The second barrier pattern 162a of the through silicon via 168 may be conformally formed on an inner surface of the via hole 160. Thus, the second barrier pattern 162a of the through silicon via 168 may contact at least a portion of the upper surface of the first barrier pattern 112. In addition, the second barrier pattern 162a may have a first bent portion between the first portion and the second portion. The second seed copper pattern 164a may be conformally formed on a surface of the second barrier pattern 162a. Thus, the second seed copper pattern 164a may also include a second bent portion.

The second copper pattern 166a may be formed on the second seed copper pattern 164a to fill the via hole 160. Thus, the second copper pattern 166a may have a third bent portion. In the second copper pattern 166a, a width of an upper portion formed over the third bent portion may be greater than a width of a lower portion formed under the third bent portion. Also, the third bent portion may be positioned above the upper surface of the pad pattern 116.

The through silicon via 168 may be isolated from the substrate 100a by the insulation liner 152b. The insulation liner 152b may include, e.g., silicon oxide. A lower surface of the insulation liner 152b may be positioned between the upper surface of the first insulating interlayer 110 and the upper surface of the pad pattern 116. Thus, the lower surface of the insulation liner 152b may be spaced apart from the upper surface of the pad pattern 116, and a lower sidewall of the through silicon via 168 may contact the first insulating interlayer 110.

Metal contaminants, e.g., copper contaminations, may not be attached on a surface of the insulation liner 152b. Thus, the insulation liner 152b may have excellent insulating properties. In addition, a failure of reliability of the semiconductor device 190 due to the metal contaminants may decrease.

FIGS. 3 to 12 are cross-sectional views illustrating stages of a method of manufacturing a semiconductor device including a through silicon via in accordance with example embodiments.

Figure 3:
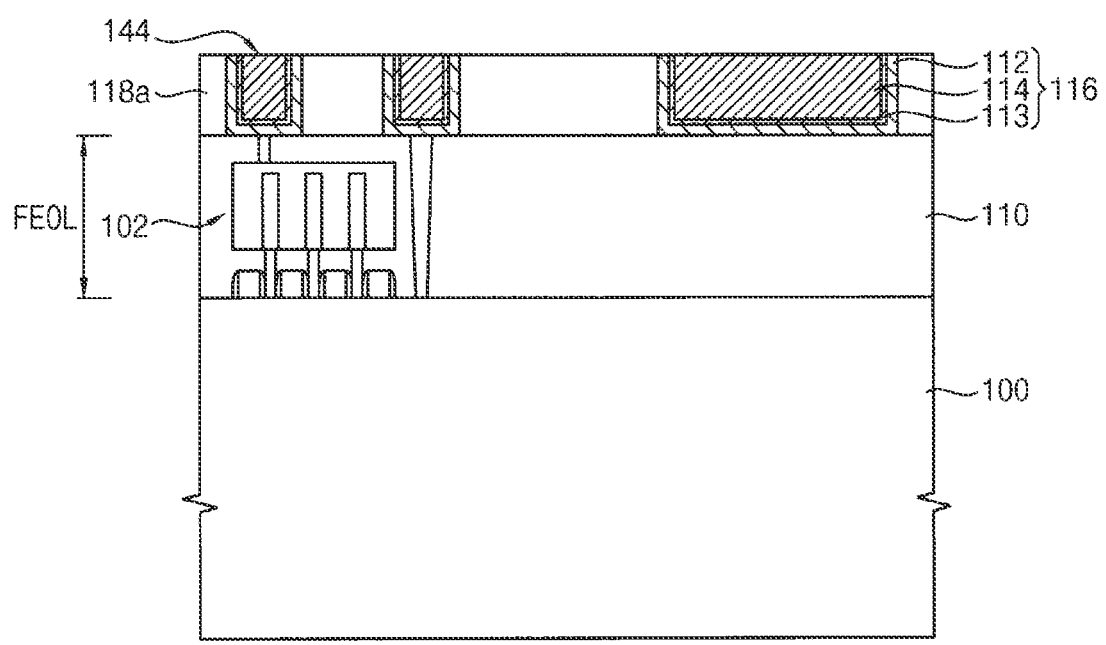
FIGS. 3 to 12 are cross-sectional views illustrating stages of a method of manufacturing a semiconductor device including a through silicon via in accordance with example embodiments.

Referring to FIG. 3, circuit elements 102 including transistors may be formed on a first surface of a bare substrate 100.

A first insulating interlayer 110 may be formed on the first surface of the bare substrate 100 to cover the circuit elements 102. The first insulating interlayer 110 may include, e.g., silicon oxide.

After forming the first insulating interlayer 110, a plurality of lower contact plugs may be further formed to be electrically connected to the circuit elements 102. Then, a planarization process may be performed such that an upper surface of the first insulating interlayer 110 may be planarized. Thus, a front end of line (FEOL) process of the semiconductor device may be completed.

When subsequent processes are performed, the circuit elements 102 should not be deteriorated. Therefore, preferably, the subsequent processes may be performed at a temperature below about 500° C.

A lower second insulating interlayer 118a may be formed on the first insulating interlayer 110. Portions of the lower second insulating interlayer 118a may be etched to form a plurality of first openings, and a pad pattern 116 and a first wiring structure 144 may be formed to fill the first openings. The first openings may expose an upper surface of the first insulating interlayer 110.

Particularly, a first barrier layer may be formed on an inner surface of the first opening and the lower second insulating interlayer 118a. The first barrier layer may include, e.g., tantalum, tantalum nitride, etc. A first seed copper layer may be conformally formed on the first barrier layer. The first barrier layer and the first seed copper layer may be formed by a physical vapor deposition process such as a sputtering process. A first copper layer may be formed on the first seed copper layer. For example, the first copper layer may be formed by an electroplating process. Then, the first copper layer, the first seed copper layer, and the first barrier layer are planarized until an upper surface of the lower second insulating interlayer 118a is exposed to form the pad pattern 116 and the first wiring structure 144 filling each of the first openings. The pad pattern 116 and the first wiring structure 144 may include a first barrier pattern 112, a first seed copper pattern 113, and a first copper pattern 114.

In example embodiments, the first wiring structure 144 may contact the lower contact plug so that the first wiring structure 144 may be electrically connected with the circuit elements 102. In example embodiments, the pad pattern 116 may be positioned to face a through silicon via that is subsequently formed.

Figure 4:
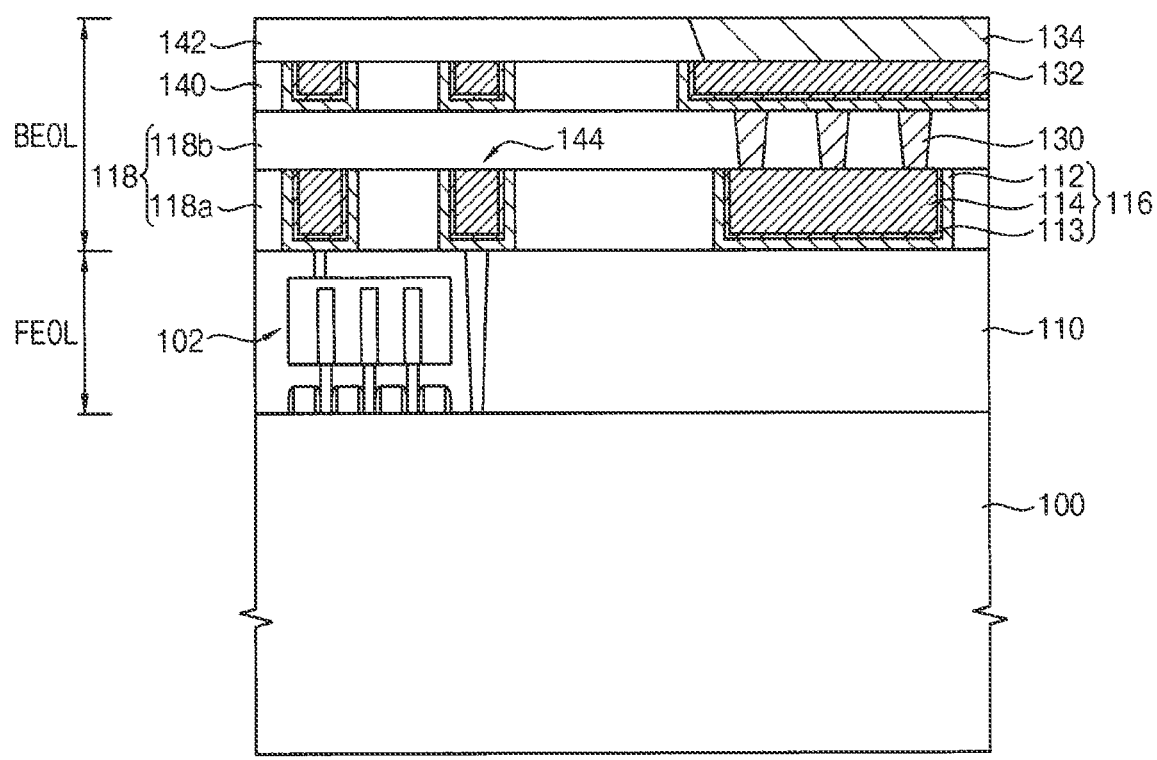

Referring to FIG. 4, an upper second insulating interlayer 118b may be formed to cover the lower second insulating interlayer 118a, the pad pattern 116, and the first wiring structure 144. A contact plug 130 may be formed to be electrically connected with the pad pattern 116 through the upper second insulating interlayer 118b. As the lower second insulating interlayer 118a and the upper second insulating interlayer 118b are formed of the same material, the lower second insulating interlayer 118a and the upper second insulating interlayer 118b may be merged into a second insulating interlayer 118. The second insulating interlayer 118 will be described below.

Upper wirings may be further formed on the second insulating interlayer 118. In example embodiments, a third insulating interlayer 140 may be formed on the second insulating interlayer 118. A second wiring structure 132 may be formed in the third insulating interlayer 140.

A fourth insulating interlayer 142 may be formed on the third insulating interlayer 140 and the second wiring structure 132. A pad electrode 134 may be formed in the fourth insulating interlayer 142. In example embodiments, the second wiring structure 132 and the pad electrode 134 may be electrically connected with the pad pattern 116. Also, the pad pattern 116 may be electrically connected with the circuit elements 102 through the wirings. Thus, the wiring process of the back end of line (BEOL) of the semiconductor device can be completed.

Figure 5:
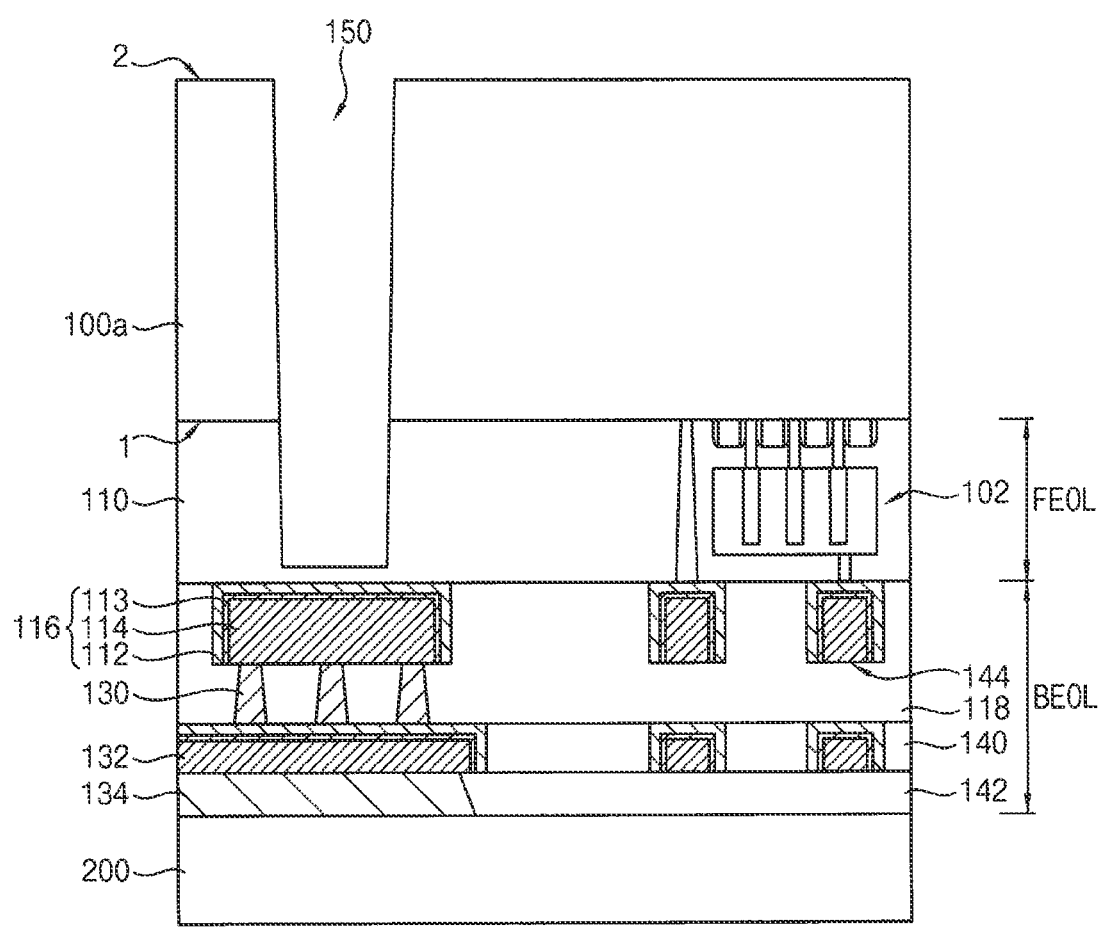

Referring to FIG. 5, the supporting substrate 200 may be attached on the fourth insulating interlayer 142. Then, the bare substrate 100 is turned over so that a second surface of the bare substrate 100 may be positioned on an upper side. The second surface of the bare substrate 100 may be grinded to form a substrate 100a having a thickness smaller than that of the bare substrate 100. Thereafter, a protective layer may be further formed on the second surface 2 of the substrate 100a.

As the second surface 2 of the substrate 100a may face upward, the first barrier pattern 112 may correspond to a top portion of the pad pattern 116. That is, in the pad pattern 116, a sidewall and an upper surface of the first copper pattern 114 may be covered with the first seed copper pattern 113 and the first barrier pattern 112 sequentially stacked. Also, the first barrier pattern 112 may contact a lower surface of the first insulating interlayer 110.

A portion of the substrate 100a may be etched from the second surface 2 to the first surface 1 of the substrate, and a portion of the first insulating interlayer 110 underlying the substrate 100a, may be sequentially etched to form a preliminary via hole 150. The preliminary via hole 150 may be formed through the substrate 100a opposite to the pad pattern 116. In example embodiments, the aspect ratio of the preliminary via hole 150 may be between about 10:1 and about 100:1.

The etching process may include an anisotropic etching process. For example, the etch process may include a reactive ion etch process (RIE). In example embodiments, a sidewall of the preliminary via hole 150 may have a slope so that a width of the preliminary via hole 150 is gradually decreased from the second surface 2 toward the first surface 1 of the substrate 100a.

Figure 6:
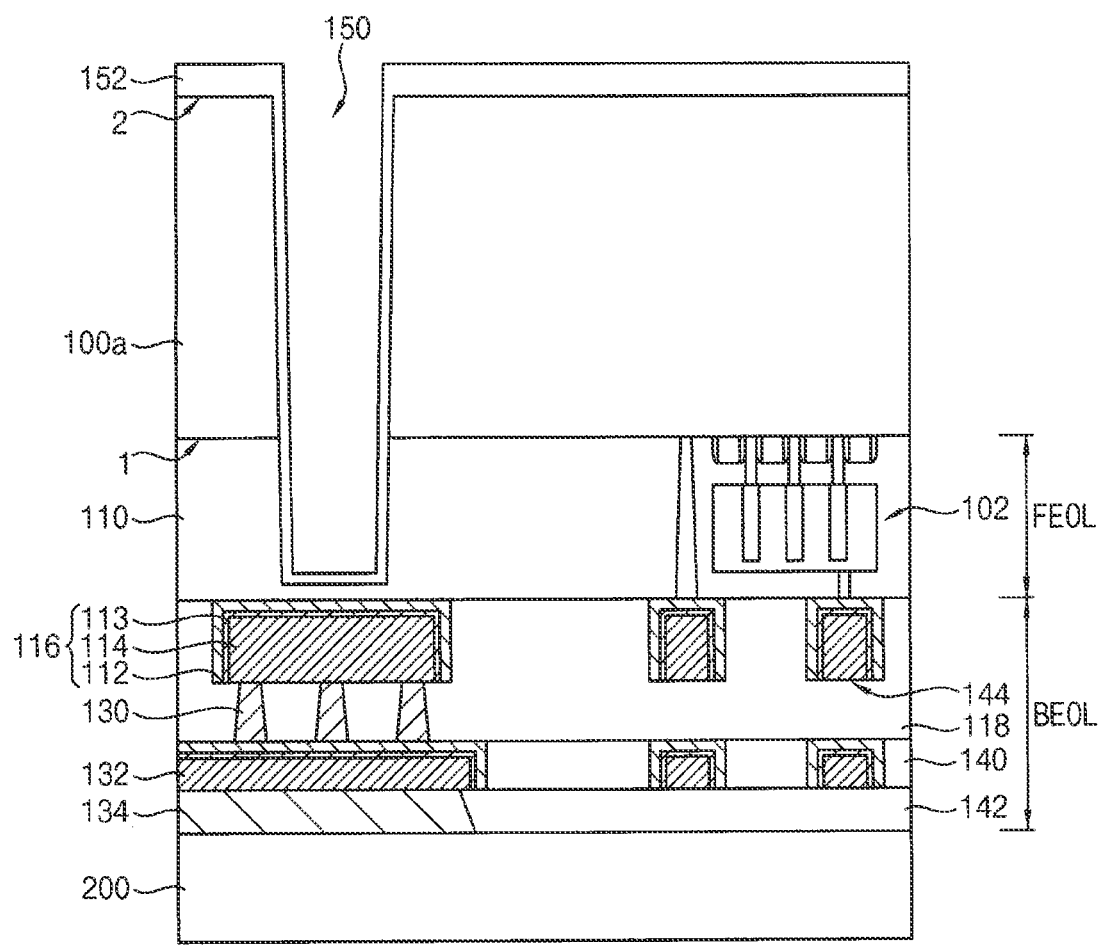

Referring to FIG. 6, a first insulation liner layer 152 may be conformally formed on the substrate 100a and the first insulating interlayer 110 exposed by the preliminary via hole 150.

In example embodiments, the first insulation liner layer 152 formed on a surface of the preliminary via hole 150 may have a first thickness, and the first insulation liner layer 152 formed on the second surface 2 of the substrate 100a may have a second thickness greater than the first thickness.

Figure 7:
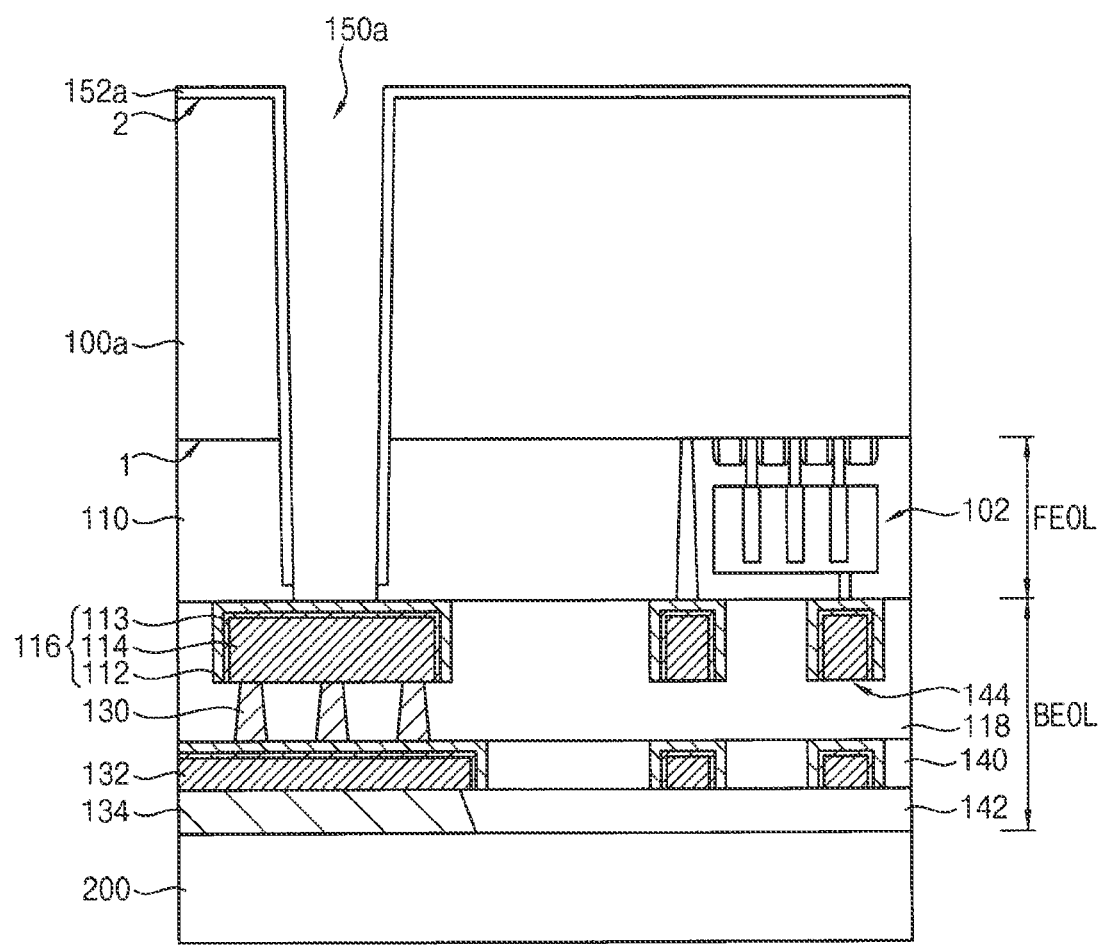

Referring to FIG. 7, the first insulation liner layer 152 may be anisotropically etched, and then the first insulating interlayer 110 exposed by the preliminary via hole 150 may be etched to form a first via hole 150a exposing a surface of the first barrier pattern 112.

In the etching process, the first insulation liner layer 152 formed on the second surface 2 of the substrate 100a may be partially etched. In some example embodiments, the first insulation liner layer 152 formed on the second surface 2 of the substrate 100a may be completely removed.

Thus, a second insulation liner layer 152a may be formed on a sidewall of the first via hole 150a and the second surface 2 of the substrate 100a. A lower surface of the second insulation liner layer 152a formed in the first via hole 150a may be spaced apart from an upper surface of the first barrier pattern 112.

The etching process may be stopped at the surface of the first barrier pattern 112 so that the first seed copper pattern 113 and the first copper pattern 114 may not be exposed by a bottom of the first via hole 150a.

Figure 8:
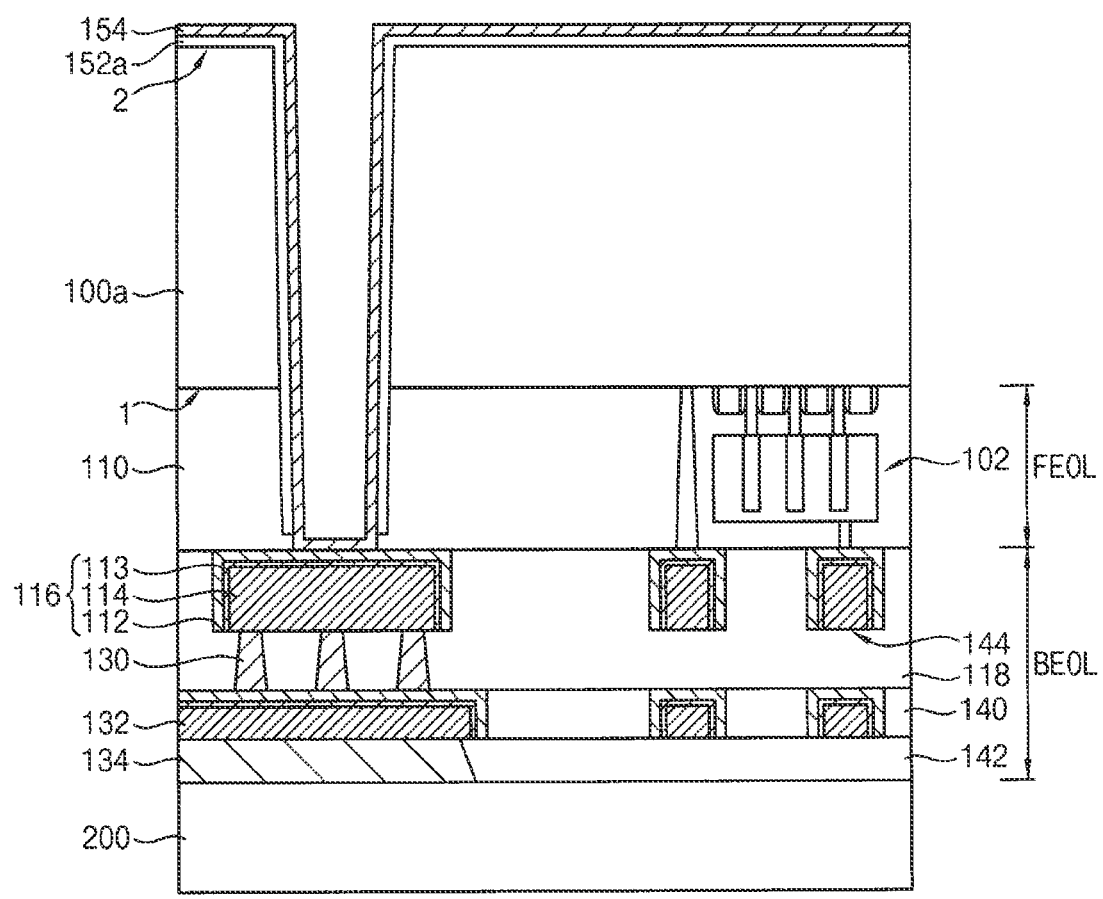

Referring to FIG. 8, a sacrificial layer 154 may be conformally formed on the second insulation liner layer 152a and the first barrier pattern 112 and the first insulating interlayer 110 exposed by the first via hole 150a. The sacrificial layer 154 may be formed in the first via hole 150a to have a third thickness.

In example embodiments, the sacrificial layer 154 may be conformally formed in the first via hole 150a having a high aspect ratio, and the sacrificial layer 154 may include a material that may be easily removed by wet etching. When the sacrificial layer 154 is removed, the second insulation liner layer 152a and the first insulating interlayer 110 including the silicon oxide may not be removed. Thus, the sacrificial layer 154 may include a material having a high etch selectivity with respect to the silicon oxide. Also, the sacrificial layer 154 may be formed of a material that may be formed at a temperature below about 500° C. In example embodiments, the sacrificial layer 154 may be formed by a physical vapor deposition process such as a sputtering process.

In example embodiments, the sacrificial layer 154 may be formed of titanium, titanium nitride, or the like. For example, the sacrificial layer 154 may be formed of a titanium layer.

Figure 9:
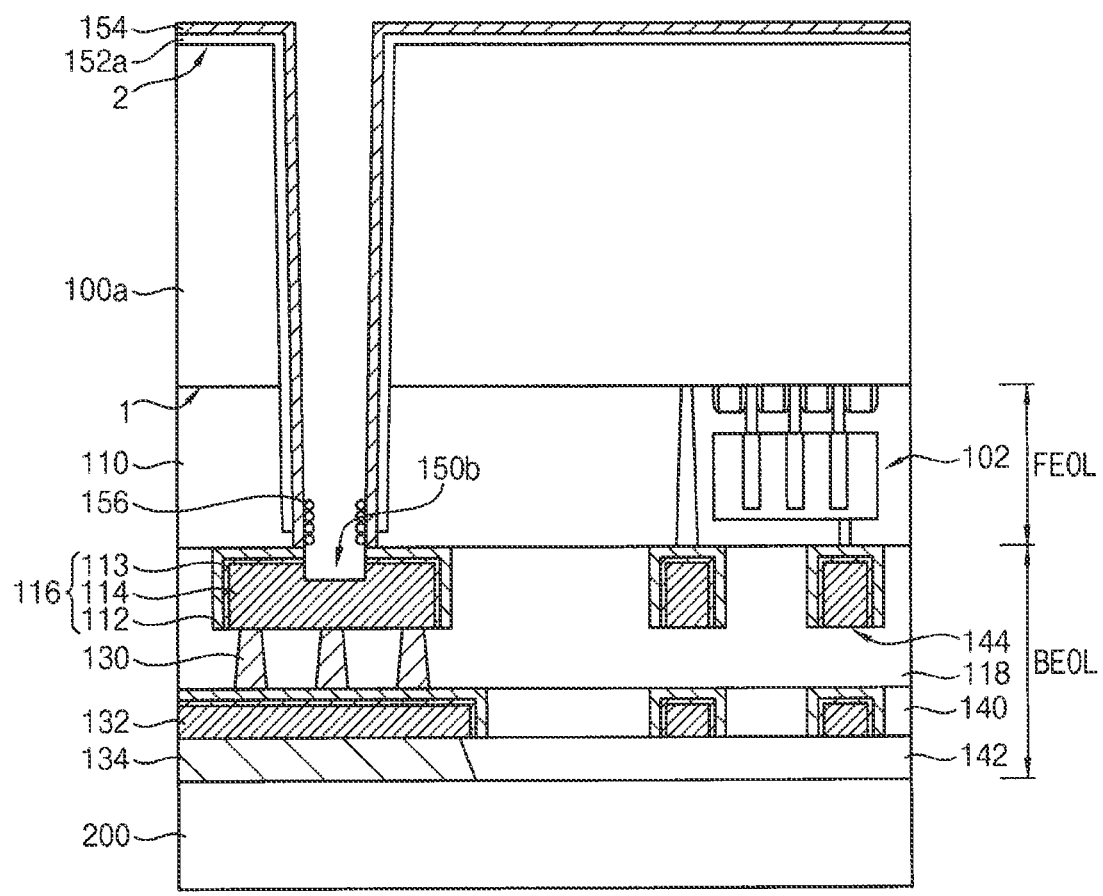

Referring to FIG. 9, the sacrificial layer 154 may be anisotropically etched. Then, the first barrier pattern 112 and the first seed copper pattern 113 on a bottom of the first via hole 150a and an upper surface of the first copper pattern 114 may be partially etched to form a second via hole 150b. The second via hole 150b may be formed under the first via hole 150a, and the second via hole 150b may be communicated with the first via hole 150a. The second via hole 150b may have a width less than a width of the first via hole 150a.

The etching process may include an anisotropic etching process. For example, the etch process may include an RIE process.

When the first seed copper pattern 113 and the first copper pattern 114 are etched, the etched copper may be resputtered to a lower sidewall of the first via hole 150a and the second via hole 150b. Thus, copper contaminations 156 may be attached on a surface of the sacrificial layer 154 corresponding to the lower sidewall of the first via hole 150a and the second via hole 150b.

Figure 10:
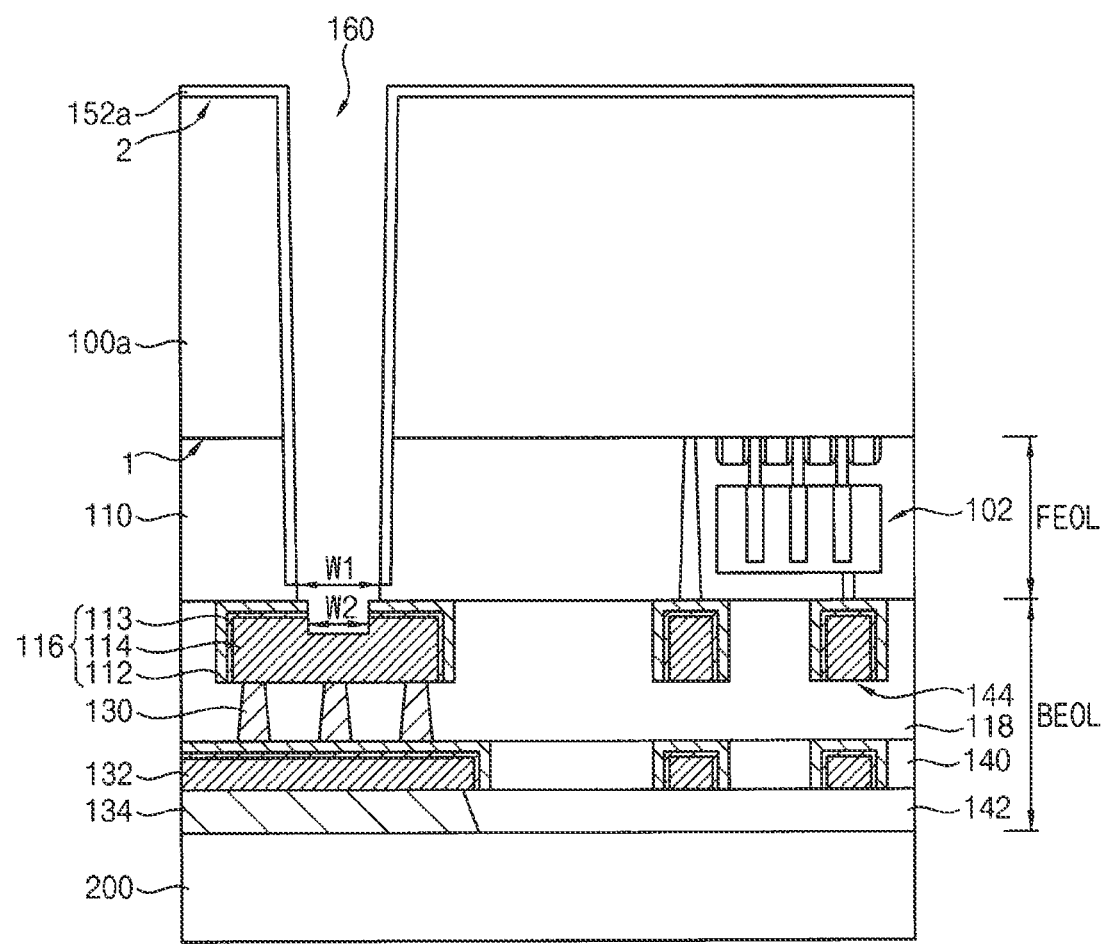

Referring to FIG. 10, the sacrificial layer 154 may be removed by an isotropic etching process. The isotropic etching process may include, e.g., a wet etching process. The sacrificial layer 154 may be etched to form a via hole 160 including the first via hole 150a and the second via hole 150b.

By removing the sacrificial layer 154, the copper contaminations 156 attached on the sacrificial layer 154 may also be removed. That is, the copper contaminations 156 may be removed along with the sacrificial layer 154. Thus, the copper contaminations 156 may not remain on the second insulation liner layer 152a and the first insulating interlayer 110 exposed by the via hole 160. When the wet etching process is performed, the sacrificial layer 154 and the copper contaminations 156 may be removed without damaging the second insulation liner layer 152a.

In example embodiments, when the sacrificial layer 154 is formed of titanium, the sacrificial layer 154 may be easily removed by the wet etching process. In this case, an etchant may include, e.g., dilute hydrofluoric acid (DHF) or a mixed solution of KOH and $H_2O_2$.

The via hole 160 may have a first portion passing through the substrate 101a and the first insulating interlayer 110 and a second portion under the first portion and extending to the first copper pattern 114 of the pad pattern 116. The first portion of the via hole 160 may be positioned above an upper surface of the pad pattern 116.

The width W1 of the first portion of the via hole 160 may be greater than the width W2 of the second portion. The first and second portions of the via hole 160 may communicate with each other. Also, the via hole 160 may have a bent portion at a boundary between the first portion and the second portion.

In example embodiments, a bottom of the first portion of the via hole 160 may exposed a portion of an upper surface of the first barrier pattern 112. In example embodiments, the second portion of the via hole 160 may be bent due to a thickness of the sacrificial layer 154. In example embodiments, a bottom of the second portion of the via hole 160 may expose an upper surface of the first copper pattern 114.

Figure 11:
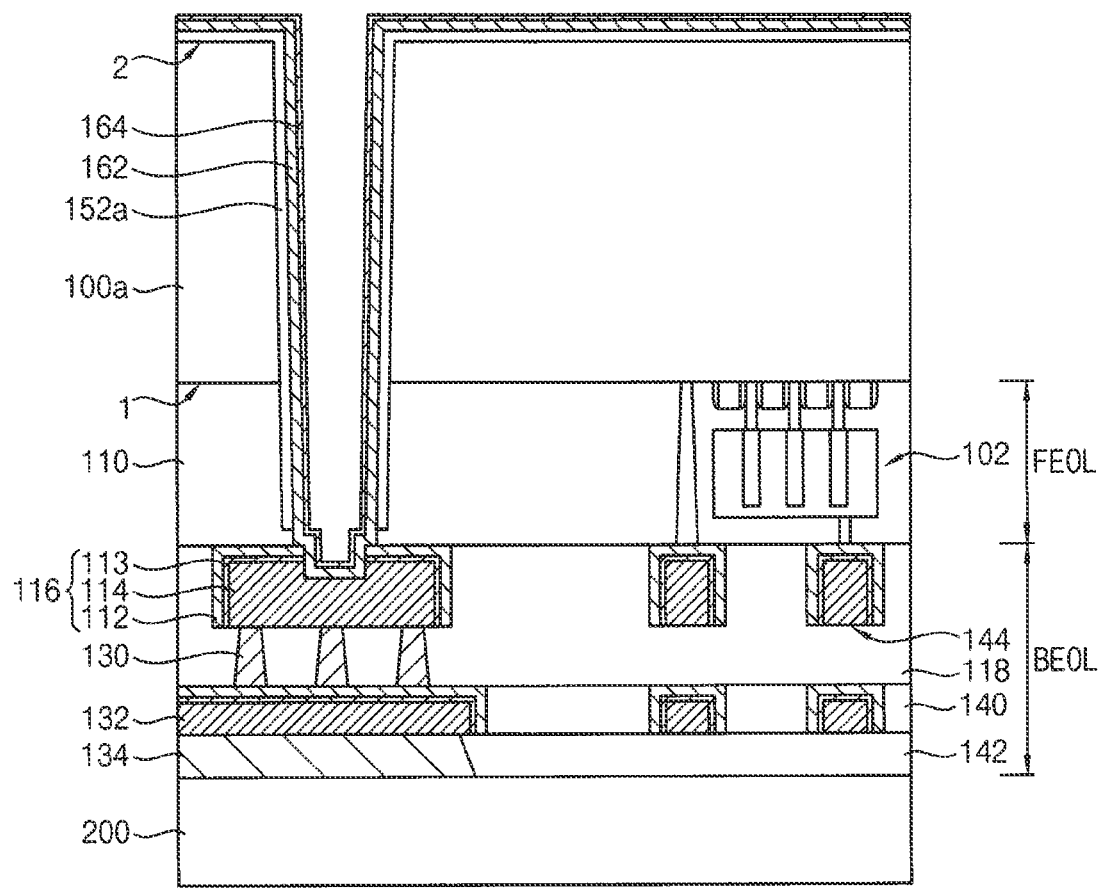

Referring to FIG. 11, a second barrier layer 162 may be conformally formed on the second insulation liner layer 152a, the first insulating interlayer 110, the first barrier pattern 112, and a first seed copper pattern 113 and the first copper pattern 114 exposed by the via hole 160. Also, the second seed copper layer 164 may be formed on the second barrier layer 162.

Each of the second barrier layer 162 and the second seed copper layer 164 may be formed along the bent portion between the first and second portions of the via hole 160. The second barrier layer 162 may contact the upper surface of the first barrier pattern 112. The second barrier layer 162 may include, e.g., tantalum, tantalum nitride, etc.

The second barrier layer 162 and the second seed copper layer 164 may be formed by a physical vapor deposition process such as a sputtering process.

Figure 12:
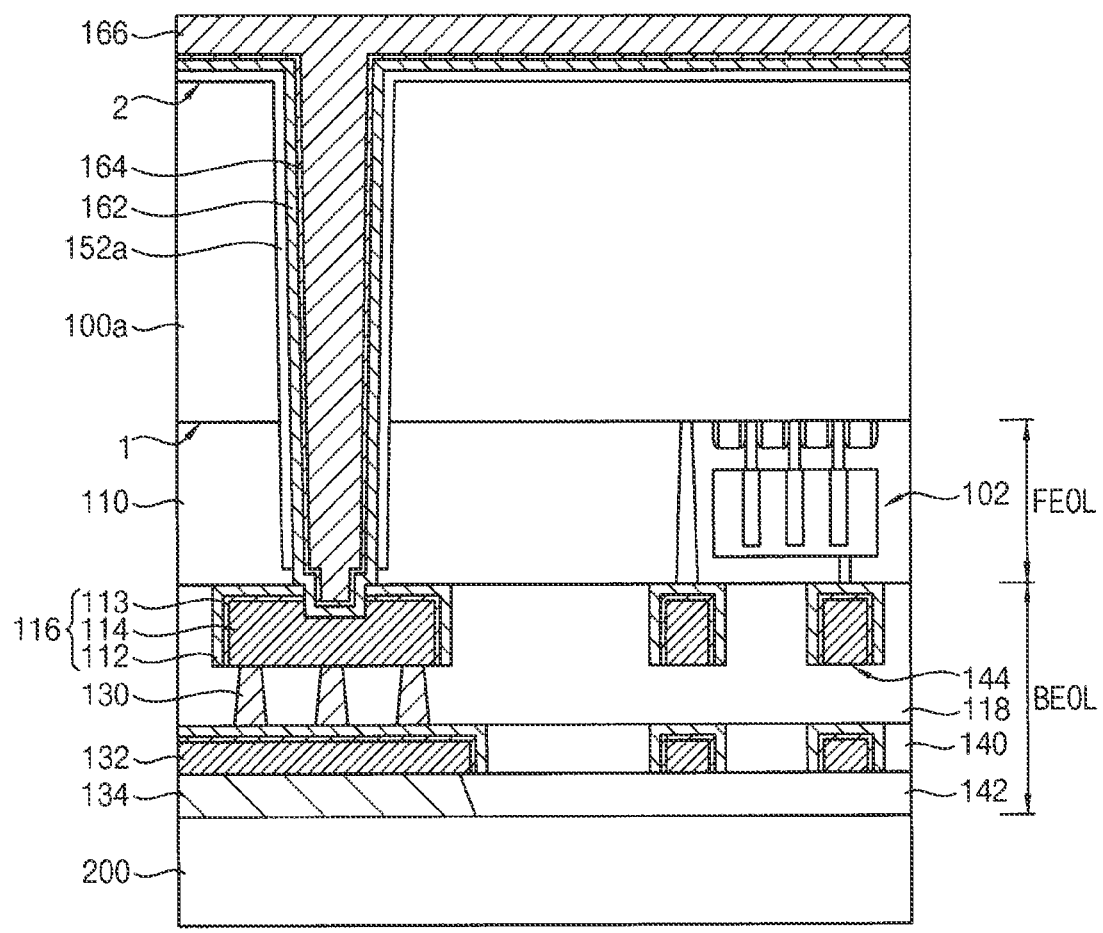

Referring to FIG. 12, a second copper layer 166 may be formed on the second seed copper layer 164 to completely fill the via hole 160. The second copper layer 166 may be formed by, e.g., an electroplating process.

The second copper layer 166, the second seed copper layer 164, the second barrier layer 162 and the second insulation liner layer 152a may be planarized until the second surface 2 of the substrate 100a may be exposed to form a through silicon via 168 in the via hole 160, as shown in FIG. 1. The through silicon via 168 may include a second barrier pattern 162a, a second seed copper pattern 164a, and a second copper pattern 166a.

Also, an insulation liner 152b may be formed on a sidewall of the through silicon via 168 to surround the through silicon via 168. A bottom of the insulation liner 152b may be positioned between the upper surface of the first insulating interlayer 110 and the upper surface of the pad pattern 116. Thus, the bottom of the insulation liner 152b may be spaced apart from the upper surface of the pad pattern 116.

As described above, the copper contaminations 156 generated by the etching process may be deposited on the sidewall of the sacrificial layer 154. Thus, while the sacrificial layer 154 is removed, the copper contaminations 156 may be removed together with the sacrificial layer 154.

The through silicon via 168 formed by above processes may have the first portion passing through the substrate 101a and the first insulating interlayer 110 and the second portion under the first portion and extending to a first copper pattern 114 of the pad pattern 16. Also, the boundary between the first and second portions of the through silicon via 168 may have a bent portion. The second barrier pattern 162a included in the through silicon via 168 may contact at least portion of the upper surface of the first barrier pattern 112 included in the pad pattern 116.

Figure 13:
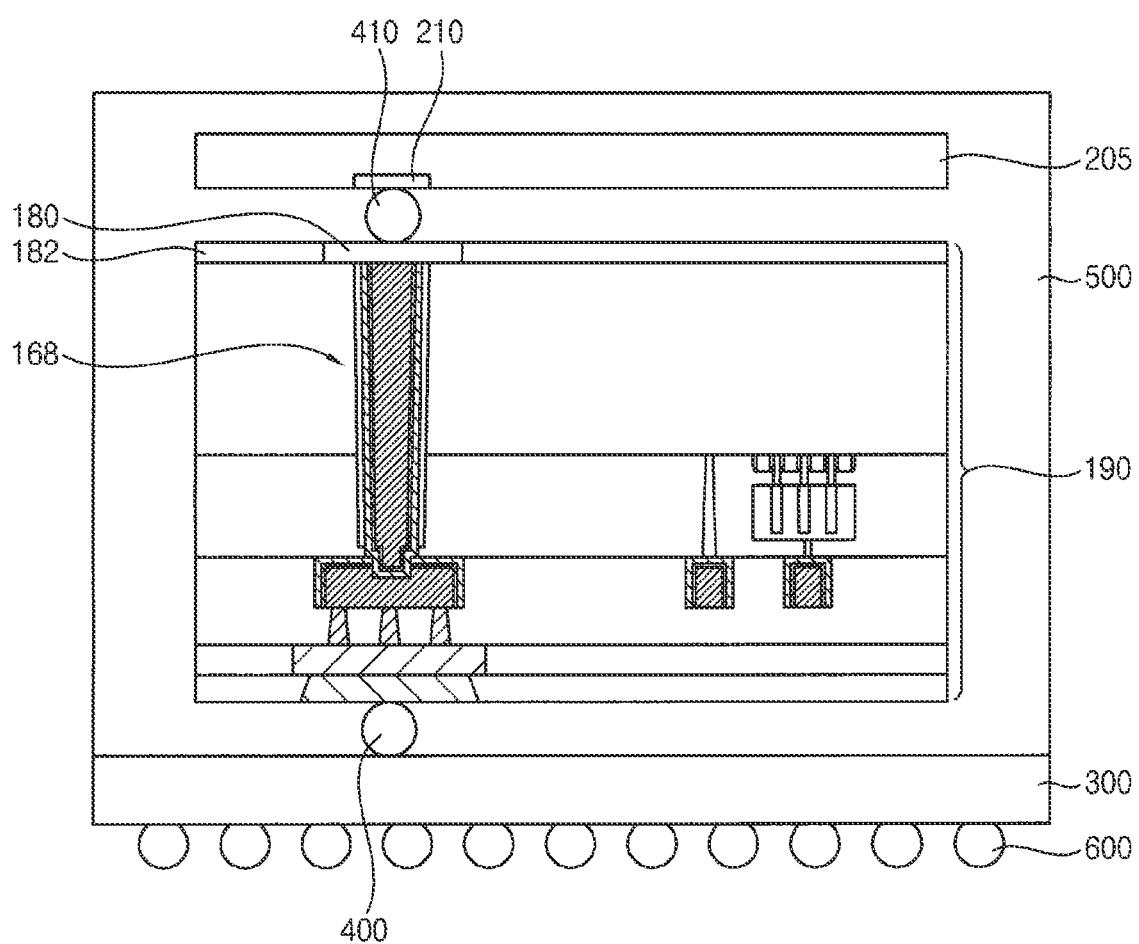
FIG. 13 is a cross-sectional view illustrating a multi-chip package in accordance with example embodiments that includes the semiconductor device shown in FIG. 1.

FIG. 13 is a cross-sectional view illustrating a multi-chip package in accordance with example embodiments.

Referring to FIG. 13, the multi-chip package device may include a package substrate 300, a first semiconductor device 190, a second semiconductor device 205, first conductive bump 400, second conductive bump 410, a molding member 500, and external connection terminals 600.

The package substrate 300 may include an insulation substrate and conductive patterns. The conductive patterns may be formed in the insulation substrate. Each of the conductive patterns may have an upper portion exposed by an upper surface of the insulation substrate and a lower portion exposed by a lower surface of the insulation substrate.

The first semiconductor device 190 may be disposed on an upper surface of the package substrate 300. In example embodiments, the first semiconductor device 190 may have a structure substantially the same as that of the semiconductor device shown in FIG. 1. Thus, the same reference numerals may refer to the same elements and any further illustrations with respect to the same elements may be omitted herein for brevity.

In the first semiconductor device 190, an upper pad 180 may be further formed on an upper surface of the through silicon via 168. In addition, an upper insulation layer 182 may be further formed at sides of the upper pad 180.

The first conductive bump 400 may be interposed between the package substrate 300 and the first semiconductor device 190. In example embodiments, the first conductive bump 400 may contact the upper portion of the conductive pattern of the package substrate 300 and the pad electrode of the first semiconductor device 190, respectively. Thus, the package substrate 300 and the first semiconductor device 190 may be electrically connected by the first conductive bump 400.

The second semiconductor device 205 may be stacked on the first semiconductor device 190. The second semiconductor device 205 may include a pad 210. The pad 210 may be disposed at the lower surface of the second semiconductor device 205.

The second conductive bump 410 may be disposed between the first semiconductor device 190 and the second semiconductor device 205. In example embodiments, the second conductive bump 410 may contact the upper pad 180 of the first semiconductor device 190 and the pad 210 of the second semiconductor device 205. Thus, the through silicon via 168 of the first semiconductor device 190 and the second semiconductor device 205 may be electrically connected to each other.

The molding member 500 may be formed on the upper surface of the package substrate 300 to cover the first semiconductor device 190 and the second semiconductor device 205. The molding member 500 may include an epoxy molding compound (EMC).

The external connection terminals 600 may be mounted on a lower surface of the package substrate 300. The external connection terminals 600 may be electrically connected to the conductive pattern of the package substrate 300. The external connection terminals 600 may include solder balls.

In example embodiments, as shown in FIG. 13 the multi-chip package may include two stacked semiconductor devices 190 and 205. However, in some example embodiments, the multi-chip package may include three or more stacked semiconductor devices. In this case, each of the stacked semiconductor devices may include through silicon via shown in FIG. 1, except for an uppermost semiconductor device.

In example embodiments, the through silicon via may not include copper contaminations. Thus, reliability defects due to the copper contaminations may be reduced.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. As used herein, the term "and/or" includes any and all combinations of one or more of the associated listed items.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   circuit devices disposed on a first surface of a substrate;
   a first insulating interlayer covering the circuit devices disposed on the first surface of the substrate;
   a pad pattern disposed on a surface of the first insulating interlayer, the pad pattern comprising a first copper pattern;
   a second insulating interlayer covering the pad pattern disposed on the surface of the first insulating interlayer; and
   a through silicon via extending from a second surface of the substrate that is a surface different from the first surface of the substrate, the through silicon via passing through the substrate and the first insulating interlayer, and contacting the first copper pattern of the pad pattern,
   wherein the through silicon via comprises a first portion passing through the substrate and the first insulating interlayer, and a second portion under the first portion and extending to an inner portion of the pad pattern,
   wherein a portion of a bottom of the first portion contacts an upper portion of the pad pattern, and
   wherein an entire sidewall and a bottom of the second portion contact the pad pattern.

2. The semiconductor device of claim 1, wherein the bottom of the second portion contact the first copper pattern of the pad pattern.

3. The semiconductor device of claim 1, wherein a width of the first portion is greater than a width of the second portion, at a portion adjacent to a boundary between the first portion and the second portion.

4. The semiconductor device of claim 1, wherein a boundary of the through silicon via has a bent portion between the first portion and the second portion.

5. The semiconductor device of claim 1, wherein the pad pattern comprises the first copper pattern, a first seed copper pattern and a first barrier pattern,
   wherein a stacked structure of the first seed copper pattern and the first barrier pattern is conformally formed on an upper surface and a sidewall of the first copper pattern, and
   wherein the first barrier pattern is exposed at an upper surface of the pad pattern.

6. The semiconductor device of claim 1, wherein the through silicon via is formed in a via hole, and
   wherein the via hole includes a first hole passing through the substrate and the first insulating interlayer and a second hole communicating with the first hole and having an inner width different from that of the first hole.

7. The semiconductor device of claim 6, wherein the through silicon via comprises a second barrier pattern, a second seed copper pattern, and a second copper pattern, and
   wherein a stacked structure of the second barrier pattern and the second seed copper pattern is conformally formed on a surface of the via hole, and the second copper pattern is formed on the second seed copper pattern to fill the via hole.

8. The semiconductor device of claim 7, wherein the upper portion of the pad pattern directly contacts the second barrier pattern of the bottom of the first portion.

9. The semiconductor device of claim 1, further comprising an insulation liner disposed on a sidewall of the through silicon via.

10. The semiconductor device of claim 9, wherein a bottom surface of the insulation liner is interposed between an upper surface of the first insulating interlayer and an upper surface of the pad pattern.

11. A semiconductor device, comprising:
    a first insulating interlayer disposed on a first surface of a substrate;
    a pad pattern disposed on a surface of the first insulating interlayer, the pad pattern comprising a first copper pattern, a first seed copper pattern and a first barrier pattern, and the first barrier pattern being exposed at an upper surface of the pad pattern; and
    a through silicon via extending from a second surface of the substrate that is a surface different from the first surface of the substrate, the through silicon via passing through the substrate and the first insulating interlayer, and contacting the first copper pattern of the pad pattern,
    wherein the through silicon via comprises a first portion passing through the substrate and the first insulating interlayer, and a second portion under the first portion and extending to an inner portion of the pad pattern,
    wherein a portion of a bottom of the first portion contacts the first barrier pattern of the upper surface of the pad pattern, and
    wherein an entire sidewall and a bottom of the second portion contact the first copper pattern, the first seed copper pattern and the first barrier pattern in the pad pattern.

12. The semiconductor device of claim 11, wherein a width of the first portion is greater than a width of the second portion, at a portion adjacent to a boundary between the first portion and the second portion.

13. The semiconductor device of claim 11, wherein the through silicon via comprises a second barrier pattern, a second seed copper pattern, and a second copper pattern,
    wherein a stacked structure of the second barrier pattern and the second seed copper pattern covers a sidewall and a lower surface of the second copper pattern, and
    wherein the second barrier pattern directly contacts the pad pattern.

14. The semiconductor device of claim 11, further comprising an insulation liner disposed on a sidewall of the through silicon via.

15. The semiconductor device of claim 14, wherein a bottom surface of the insulation liner is interposed between an upper surface of the first insulating interlayer and the upper surface of the pad pattern.

16. A semiconductor device, comprising:
    circuit devices disposed on a first surface of a substrate;
    a first insulating interlayer covering the circuit devices disposed on the first surface of the substrate;
    a pad pattern disposed on a surface of the first insulating interlayer, the pad pattern comprising a first copper pattern, a first seed copper pattern and a first barrier pattern, the first seed copper pattern and the first barrier pattern covering the first copper pattern, and the first barrier pattern being exposed at an upper surface of the pad pattern;
    a second insulating interlayer covering the pad pattern disposed on the surface of the first insulating interlayer; and
    a through silicon via extending from a second surface of the substrate that is a surface different from the first surface of the substrate, the through silicon via passing through the substrate and the first insulating interlayer, and contacting the first copper pattern of the pad pattern,
    wherein the through silicon via comprises a first portion passing through the substrate and the first insulating interlayer, and a second portion under the first portion and extending to an inner portion of the pad pattern,
    wherein the through silicon via comprises a second barrier pattern, a second seed copper pattern, and a second copper pattern, and a stacked structure of the second barrier pattern and the second seed copper pattern covers a sidewall and a lower surface of the second copper pattern,
    wherein a portion of the second barrier pattern of a bottom of the first portion contacts the first barrier pattern of the upper surface of the pad pattern, and
    wherein an entire sidewall and a bottom of the second portion contact the pad pattern.

17. The semiconductor device of claim 16, wherein the bottom of the second portion contact the first copper pattern of the pad pattern.

18. The semiconductor device of claim 16, wherein a width of the first portion is greater than a width of the second portion, at a portion adjacent to a boundary between the first portion and the second portion.

19. The semiconductor device of claim 16, further comprising an insulation liner disposed on a sidewall of the through silicon via.

20. The semiconductor device of claim 19, wherein a bottom surface of the insulation liner is interposed between an upper surface of the first insulating interlayer and the upper surface of the pad pattern.

* * * * *